US011990445B2

(12) United States Patent
Sen

(10) Patent No.: US 11,990,445 B2
(45) Date of Patent: May 21, 2024

(54) APPARATUS AND METHOD FOR SEMICONDUCTOR DEVICE BONDING

(71) Applicant: PYXIS CF PTE. LTD., Singapore (SG)

(72) Inventor: Amlan Sen, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 361 days.

(21) Appl. No.: 16/565,589

(22) Filed: Sep. 10, 2019

(65) Prior Publication Data

US 2020/0083193 A1 Mar. 12, 2020

(30) Foreign Application Priority Data

Sep. 11, 2018 (SG) .............................. 10201807813v

(51) Int. Cl.
*H01L 23/00* (2006.01)
(52) U.S. Cl.
CPC .............. *H01L 24/75* (2013.01); *H01L 24/83* (2013.01); *H01L 2224/7565* (2013.01); *H01L 2224/75753* (2013.01)
(58) Field of Classification Search
CPC ......... H01L 24/75; H01L 24/77; H01L 24/78; H01L 24/79; H01L 2224/75753;
(Continued)

(56) References Cited

U.S. PATENT DOCUMENTS

| 7,727,800 | B2 | 6/2010 | Wan et al. |
| 8,633,441 | B2 | 1/2014 | Wang et al. |

(Continued)

FOREIGN PATENT DOCUMENTS

| JP | 3569820 B2 | * | 9/2004 | ............. H01L 24/75 |
| JP | 2006196618 A | * | 7/2006 | ............. H01L 24/75 |

(Continued)

OTHER PUBLICATIONS

Search Report dated May 8, 2020 by the Taiwan Intellectual Property Office, in related Taiwan Application No. 108132559 filed Sep. 10, 2019 (1 page) with Google machine translation (2 pages).

(Continued)

*Primary Examiner* — Livius R. Cazan
(74) *Attorney, Agent, or Firm* — Daniel F. Nesbitt; Nesbitt IP LLC

(57) ABSTRACT

An apparatus and method for semiconductor device (such as semiconductor die or die) bonding. The apparatus has a bonding assembly with a bonding head having a bonding tool for holding a semiconductor device; and a bonding head actuation mechanism for actuating the bonding tool horizontally planarly to align the semiconductor device relative to a bonding location of a substrate while the semiconductor device remains above the bonding location. The bonding assembly has a bonding assembly actuator for actuating the bonding head vertically to pick the semiconductor device and to bond the semiconductor device at the bonding location. The apparatus has a vision assembly with alignment cameras for capturing reference views of the semiconductor device and bonding location for aligning the semiconductor device relative to the bonding location, and a vision assembly actuation mechanism for actuating the alignment cameras to position the alignment cameras between the bonding tool and bonding location.

12 Claims, 9 Drawing Sheets

(58) Field of Classification Search
CPC . H01L 2224/76753; H01L 2224/77753; H01L 2224/78753
See application file for complete search history.

(56) References Cited

U.S. PATENT DOCUMENTS

| | | | |
|---|---|---|---|
| 11,600,515 | B2 | 3/2023 | Jeong et al. |
| 2003/0136523 | A1* | 7/2003 | Takahashi ............... H01L 24/81 257/E21.511 |
| 2006/0185157 | A1* | 8/2006 | Shida ..................... H01L 24/75 29/843 |
| 2014/0352141 | A1* | 12/2014 | Yasuyoshi .............. B23K 26/06 29/740 |
| 2015/0155254 | A1* | 6/2015 | Schmidt-Lange ..... B23K 31/12 228/4.1 |
| 2021/0060798 | A1 | 3/2021 | Jeong et al. |

FOREIGN PATENT DOCUMENTS

| | | | | |
|---|---|---|---|---|
| JP | 4161747 | B2 * | 10/2008 | ............. H01L 24/75 |
| JP | 2009283517 | A * | 12/2009 | ............. H01L 24/75 |
| KR | 10-2021-0112737 | | 9/2021 | |
| TW | 538657 | | 6/2003 | |
| TW | 201740793 | A | 11/2017 | |
| TW | 201801208 | A | 1/2018 | |
| TW | M594806 | U | 5/2020 | |
| WO | 98/58403 | A1 | 12/1998 | |
| WO | WO-2010024679 | A1 * | 3/2010 | ......... H05K 13/0478 |
| WO | WO-2014157134 | A1 * | 10/2014 | ....... H01L 21/67138 |

OTHER PUBLICATIONS

U.S. Appl. No. 16/783,385, filed Feb. 6, 2020, Sen.
U.S. Appl. No. 16/828,219, filed Mar. 24, 2020, Sen.

* cited by examiner

APPARATUS AND METHOD FOR SEMICONDUCTOR DEVICE BONDING

TECHNICAL FIELD

The present disclosure generally relates to semiconductor device (such as semiconductor die or die) bonding. More particularly, the present disclosure describes various embodiments of an apparatus and a method for semiconductor device (semiconductor die or die) bonding, i.e. for bonding of semiconductor components, wafers or dies.

BACKGROUND OF THE INVENTION

Many semiconductor devices, electrical components, integrated circuits, and the like are manufactured from semiconductor devices or chips which are formed together on semiconductor wafers. Said mounting is performed by a die bonding process. In said further processing, electrical connections are created with the dies and the dies are encapsulated, such as with epoxy, for protection.

In a typical die bonding process, each individual die is picked by a bonding tool from the wafer and then transported to the substrate for bonding the die to the substrate. Visual alignment is performed in the die bonding process in order to place the die correctly and accurately onto the substrate. One example of the visual alignment is that an image of the die is captured after the die is picked by the bonding tool. A motion system for moving the bonding tool to the substrate then adjusts for any misalignment of the die and moves the die to a correct location of the substrate. This die bonding process is fast and the overall throughput is high, but the accuracy of the bonded dies on the substrate is poor.

Another example of the visual alignment is that images of both the die and substrate are captured after the die is picked by the bonding tool, such as described in the die bonding apparatuses of U.S. Pat. Nos. 7,727,800 and 8,633,441, the disclosures of which are incorporated by reference in their entireties. In the die bonding apparatuses, the bonding tool moves to the wafer to pick up the die and moves to the substrate to bond the die to the substrate. Before the die is bonded to the substrate, images of the die and substrate are captured for aligning the die to the substrate. The orientation of the die held by the bonding tool is adjusted based on the image captured of the substrate before the die is placed onto the substrate. However, as the distance moved by the bonding tool between the wafer and substrate is significant in the order of tens of centimetres to metres, there are residual vibrations in the bonding tool when the bonding tool stops at the substrate before placing the die onto the substrate. If the die is bonded to the substrate before the vibrations subside, the accuracy of the bonded die would be poor. Moreover, the vibrations take a significant amount of time to subside and increases the overall time taken to bond the dies onto the substrate, thus lowering the overall throughput.

Therefore, in order to address or alleviate at least one of the aforementioned problems and/or disadvantages, there is a need to provide an improved apparatus and method for die bonding.

SUMMARY OF THE INVENTION

According to a first aspect of the present disclosure, there is an apparatus for semiconductor device (such as semiconductor die, or die) bonding. The apparatus comprises:
(a) a gantry assembly;
(b) a base assembly for supporting at least one substrate;
(c) a feeder assembly for feeding a plurality of semiconductor devices for bonding at bonding locations of the at least one substrate;
(d) at least one bonding assembly attached to the gantry assembly and positioned above the base assembly, each bonding assembly comprising:
  (i) two or more bonding heads, each bonding head comprising:
    a bonding tool for holding a semiconductor device; and
    a bonding head actuation mechanism for actuating the bonding tool horizontally planarly to concurrently align the semiconductor device relative to the respective bonding location of the substrates while the semiconductor device remains above the respective bonding location; and
  (ii) a bonding assembly actuator for actuating the bonding heads vertically to concurrently pick the semiconductor devices fed from the feeder assembly and to concurrently bond the semiconductor devices at the respective bonding locations; and
(e) a set of vision assemblies, each vision assembly comprising:
  (i) a pair of alignment cameras for capturing reference views of the semiconductor devices and the respective bonding locations; and
  (ii) a vision assembly actuation mechanism for actuating the alignment cameras to position the alignment cameras between the bonding tools and respective bonding locations,
wherein the semiconductor devices are aligned relative to the respective bonding locations based on the respective reference views.

The semiconductor device includes, but are not limited to, individual semiconductor, wafer, or integrated circuit dies, semiconductor dies, dies or chips.

The semiconductor device includes, but are not limited to, individual semiconductor, wafer, or integrated circuit dies, semiconductor dies, dies or chips.

The apparatus of the subject application has a major advantage of bonding the semiconductor devices very efficiently (such as higher than 8000 unit per hour) since the semiconductor devices are picked concurrently, then aligned to the substrates concurrently and finally bonded to the substrates concurrently. Meanwhile, each of the semiconductor devices is also bonded very precisely to the respective bonding location of the substrates. For example, the preciseness is less than 3 micrometers.

According to a second aspect of the present disclosure, there is a mechanism for aligning a semiconductor device, comprising:
(a) at least one bonding assembly positioned above at least one substrate; and
(b) a vision assembly for providing reference views of the semiconductor device and the substrate,
wherein each bonding assembly aligns the semiconductor device to the substrate according to the references views by moving the semiconductor devices both horizontally planarly and vertically.

According to a third aspect of the present disclosure, there is a method for semiconductor device bonding. The method comprises: supporting at least one substrate on a base assembly positioned below at least one bonding assembly comprising two or more bonding heads; feeding a plurality of semiconductor device to the two or more bonding heads for bonding at bonding locations of the at least one substrate; actuating each bonding head vertically for a bonding tool of the bonding head to concurrently pick the fed semiconductor devices; actuating a pair of alignment cameras to position the alignment cameras between the bonding tool and the bonding location; capturing, using the pair of alignment cameras, reference views of the semiconductor device and the respective bonding location; actuating the bonding tool horizontally planarly to align the semiconductor device relative to the bonding location based on the reference views while the semiconductor device remains above the bonding location; and actuating the bonding head vertically for the bonding tool to bond the semiconductor device at the bonding location.

An advantage of the present disclosure is that the semiconductor devices are aligned relative to the respective bonding locations based on the reference views captured by the cameras, before the semiconductor devices are bonded to the substrates. Said alignment is performed while the semiconductor devices remain above the respective bonding locations, thus requiring only micro movements of the bonding tools holding the semiconductor devices and said alignment can be completed very quickly. This increases overall throughput without compromising on positional accuracy of the bonded semiconductor devices on the substrates, resulting in bonded substrates of higher quality and better reliability.

An apparatus and a method for semiconductor device bonding according to the present disclosure are thus disclosed herein. Various features, aspects, and advantages of the present disclosure will become more apparent from the following detailed description of the embodiments of the present disclosure, by way of non-limiting examples only, along with the accompanying drawings.

DETAILED DESCRIPTION OF THE INVENTION

Figure 1A:
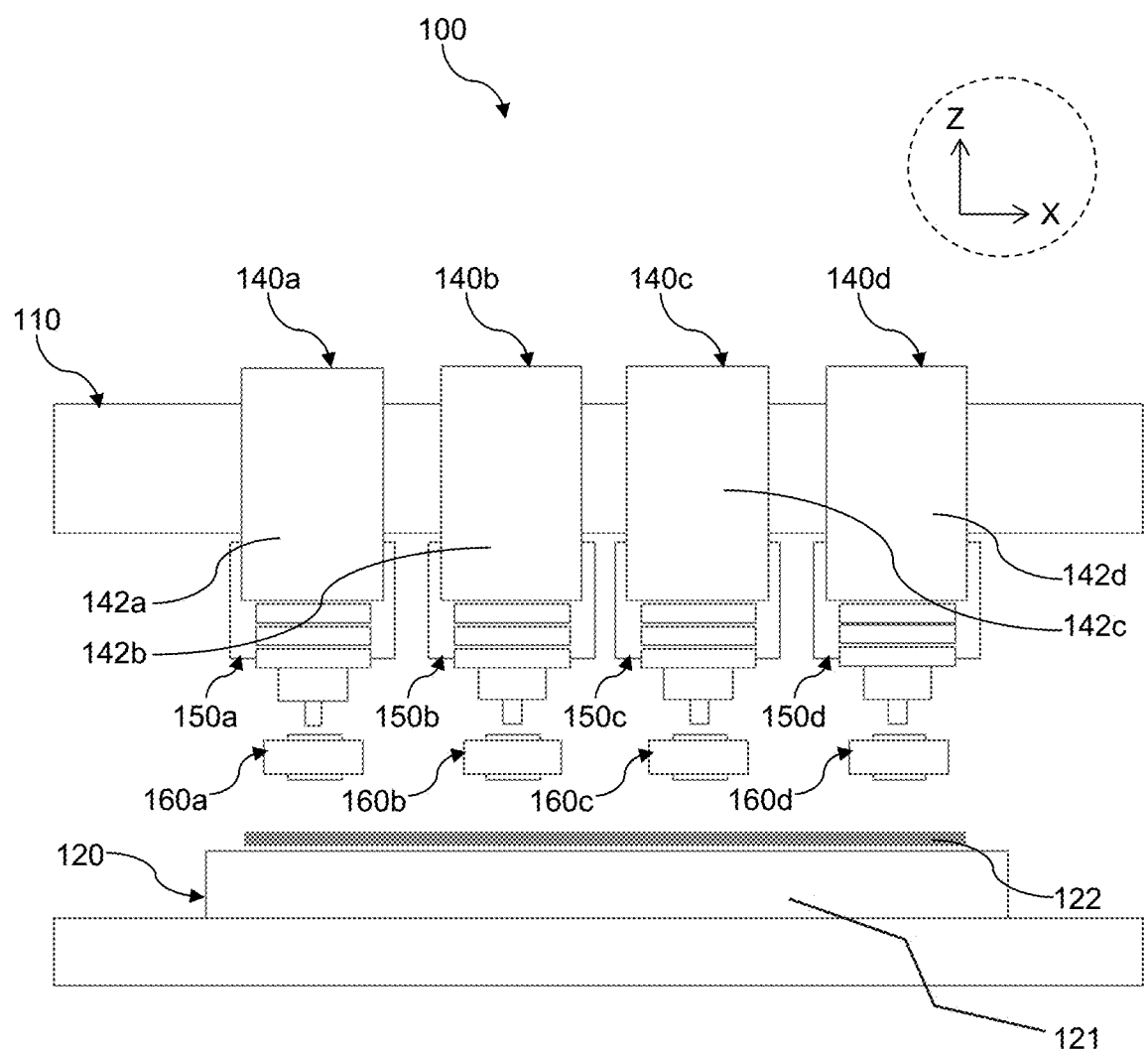
FIG. 1A to FIG. 1C are illustrations of front and side views of an apparatus for die bonding, in accordance with some embodiments of the present disclosure.

For purposes of brevity and clarity, descriptions of embodiments of the present disclosure are directed to an apparatus and a method for die bonding, in accordance with the drawings. While aspects of the present disclosure will be described in conjunction with the embodiments provided herein, it will be understood that they are not intended to limit the present disclosure to these embodiments. On the contrary, the present disclosure is intended to cover alternatives, modifications and equivalents to the embodiments described herein, which are included within the scope of the present disclosure as defined by the appended claims. Furthermore, in the following detailed description, specific details are set forth in order to provide a thorough understanding of the present disclosure. However, it will be recognized by an individual having ordinary skill in the art, i.e. a skilled person, that the present disclosure may be practiced without specific details, and/or with multiple details arising from combinations of aspects of particular embodiments. In a number of instances, well-known systems, methods, procedures, and components have not been described in detail so as to not unnecessarily obscure aspects of the embodiments of the present disclosure.

In embodiments of the present disclosure, depiction of a given element or consideration or use of a particular element number in a particular figure or a reference thereto in corresponding descriptive material can encompass the same, an equivalent, or an analogous element or element number identified in another figure or descriptive material associated therewith.

References to "an embodiment/example", "another embodiment/example", "some embodiments/examples", "some other embodiments/examples", and so on, indicate that the embodiment(s)/example(s) so described may include a particular feature, structure, characteristic, property, element, or limitation, but that not every embodiment/example necessarily includes that particular feature, structure, characteristic, property, element or limitation. Furthermore, repeated use of the phrase "in an embodiment/example" or "in another embodiment/example" does not necessarily refer to the same embodiment/example.

The terms "comprising", "including", "having", and the like do not exclude the presence of other features/elements/steps than those listed in an embodiment. Recitation of certain features/elements/steps in mutually different embodiments does not indicate that a combination of these features/elements/steps cannot be used in an embodiment.

As used herein, the terms "a" and "an" are defined as one or more than one. The use of "/" in a figure or associated text is understood to mean "and/or" unless otherwise indicated. The term "set" is defined as a non-empty finite organization of elements that mathematically exhibits a cardinality of at least one (e.g. a set as defined herein can correspond to a unit, singlet, or single-element set, or a multiple-element set), in accordance with known mathematical definitions. The recitation of a particular numerical value or value range herein is understood to include or be a recitation of an approximate numerical value or value range. As used herein, the terms "first", "second", "third", "fourth", etc. are used merely as labels or identifiers and are not intended to impose numerical requirements on their associated terms. As used herein, the term "each other" represents a reciprocal relation between two or more elements.

Figure 1B:
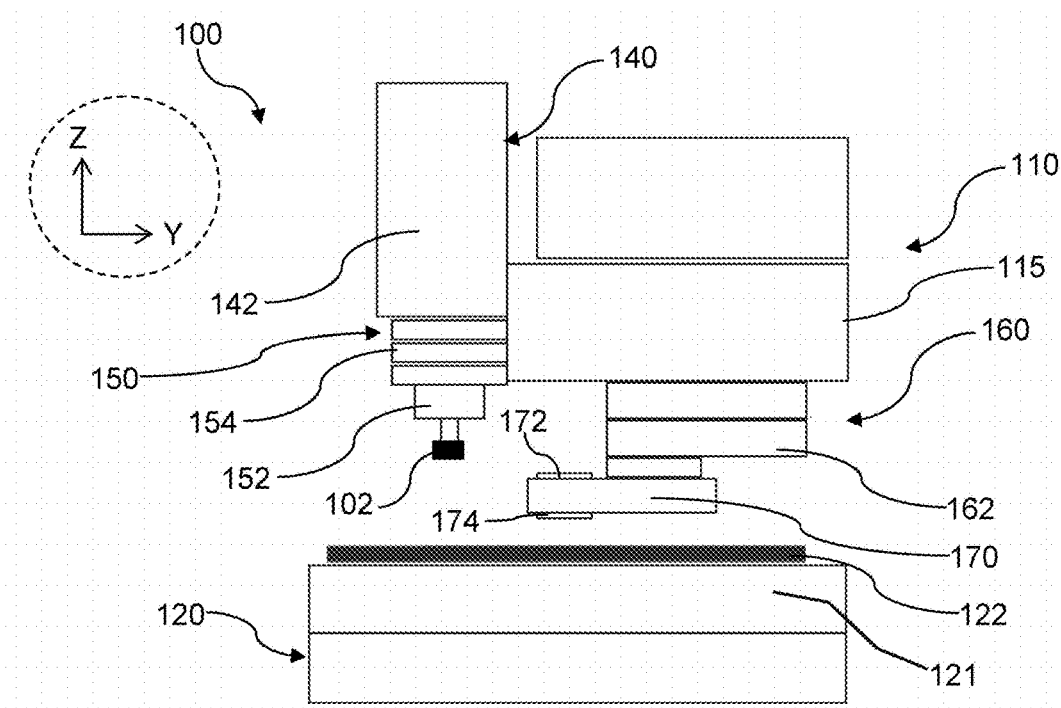

In representative or exemplary embodiments of the present disclosure, there is an apparatus 100 for die bonding as shown in FIG. 1A and FIG. 1B. The apparatus 100 includes a gantry assembly 110, a base assembly 120 having a stage 121 for supporting a set of one or more substrates 122, and a feeder assembly 130 for feeding dies 102 for bonding at bonding locations or sites of the substrates 122.

The apparatus 100 further includes a set of one or more bonding assemblies 140 attached to the gantry assembly 110 and positioned above the base assembly 120. Each bonding assembly 140 includes a set of one or more bonding heads 150 and a bonding assembly actuator 142 for actuating the bonding heads 150 vertically. The bonding assembly actuator 142 is a Z-axis actuator that actuates or moves the bonding heads 150 vertically to pick the dies 102 fed from the feeder assembly 130 and to bond the dies 102 at the respective bonding locations of the substrates 122.

The gantry assembly 110 is configured for actuating the bonding assemblies 140 horizontally planarly to position the bonding heads 150 above successive bonding locations of the substrates 122. The term "horizontally planarly" refers to planar motion along a horizontal plane, i.e. the XY-plane. For example, the gantry assembly 110 includes a gantry actuation mechanism 115, such as a XY-moving table for movement along the X- and Y-axes, configured for planar motion of the bonding assemblies 140 along the horizontal XY-plane. The gantry actuation mechanism 115 moves the bonding assemblies 140, such as along the X-axis, to adjust the spaces between the bonding assemblies 140 and also between the bonding heads 150. The bonding assemblies 140 are continually actuated to position the bonding heads 150 above the bonding locations, eventually bonding all the dies 102 at all the bonding locations of the substrates 122.

Each bonding head 150 includes a bonding tool 152 for holding a die 102, and a bonding head actuation mechanism 154 for actuating the bonding tool 152. Specifically, the bonding head actuation mechanism 154 is configured for actuating or moving the bonding tool 152 horizontally planarly to align the die 102 relative to the respective bonding location of the substrates 122 while the die 102 remains above the respective bonding location. More specifically, said actuating of the bonding tool 152 includes planar and/or angular motions of the bonding tool 152 along the horizontal XY-plane. In many embodiments, the bonding head actuation mechanism 154 comprises a precision alignment stage that includes an X-axis actuator, a Y-axis actuator, and an angular ⊖ actuator for performing micro-adjustment planar motion along the horizontal XY-plane and/or angular motion about an axis of the bonding head 150.

The apparatus 100 further includes a set of one or more camera assemblies 160 as vision assemblies attached to the gantry assembly 110. Each camera assembly 160 includes a pair of alignment cameras 170 for capturing reference views of the dies 102 and the respective bonding locations of the substrates 122. The pair of alignment cameras 170 includes an uplook camera 172 and a downlook camera 174. The uplook camera 172 is configured for capturing reference views or images of the dies 102 by looking vertically upwards to the dies 102 held by the bonding tools 152. The downlook camera 174 is configured for capturing reference views or images of the respective bonding locations of the substrates 122, whereto the dies 102 are bonded, by looking vertically downwards to the substrates 122. The dies 102 are aligned relative to the respective bonding locations based on the respective reference views.

Figure 1C:
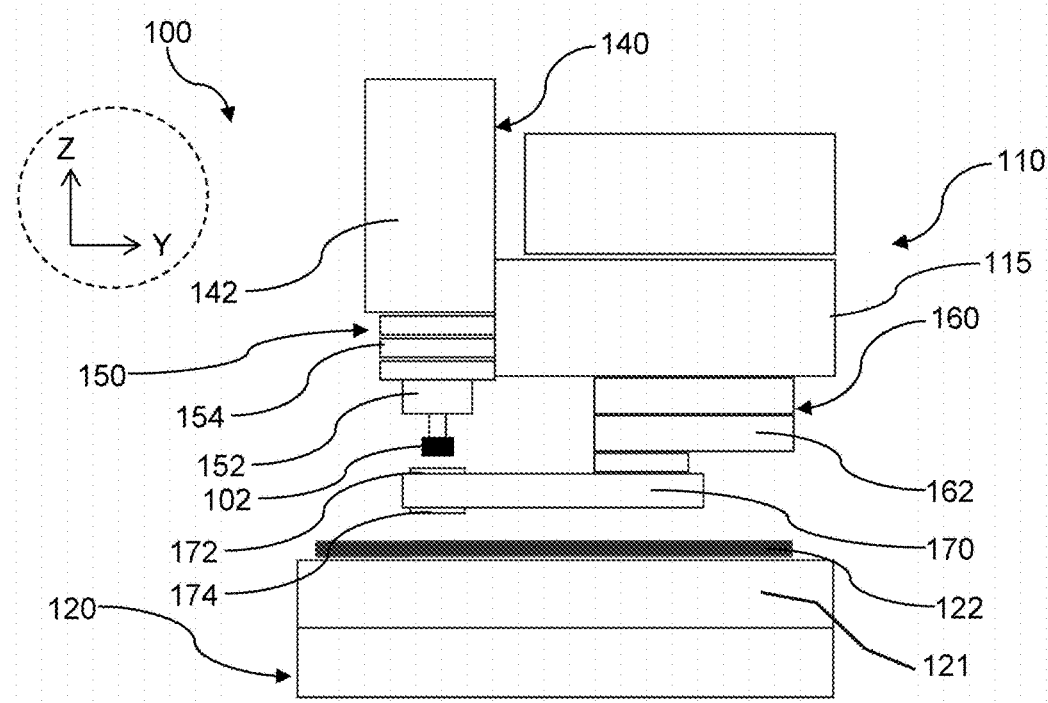

Each camera assembly 160 further includes a camera assembly actuation mechanism 162 as a vision assembly actuation mechanism for actuating the alignment cameras 170 to position the alignment cameras 170 between the bonding tools 152 and the respective bonding locations of the substrates 122, for example as shown in FIG. 1C. Said actuating of the alignment cameras 170 includes planar motion along the horizontal XY-plane. In many embodiments, the camera assembly actuation mechanism 162 includes an X-axis actuator and a Y-axis actuator for performing the planar motion. Optionally, the camera assembly actuation mechanism 162 includes a Z-axis actuator for actuating the alignment cameras 170 vertically, such as to focus on the die 102 and bonding location of the substrate 122. Each of the uplook camera 172 and downlook camera 174 may be actuatable vertically independently from each other, such that both can achieve optimal focus on the die 102 and bonding location, respectively. Further optionally, the camera assembly actuation mechanism 162 includes an angular ⊖ actuator for performing angular motion along the horizontal XY-plane.

In some embodiments as shown in FIG. 1A, the apparatus 100 includes a first bonding assembly 140a, a second bonding assembly 140b, a third bonding assembly 140c, and a fourth bonding assembly 140d. Each bonding assembly 140a-d includes a respective bonding head 150a-d and a respective bonding assembly actuator 142a-d for actuating the respective bonding head 150a-d. Thus, each bonding head 150a-d is individually and independently actuatable by the respective bonding assembly actuator 142a-d. Each bonding head 150a-d has its own independent bonding head actuation mechanism 154 for actuating the respective bonding tool 152 horizontally planarly for alignment of the die 102.

Figure 2A:
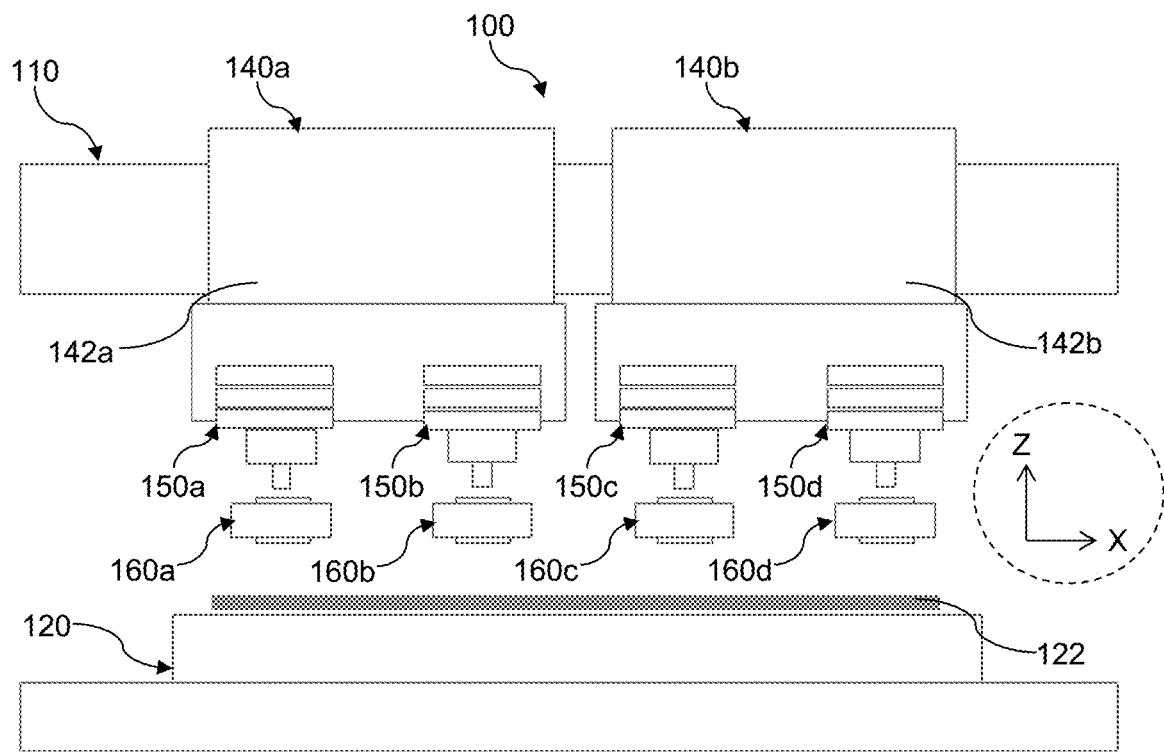
FIG. 2A and FIG. 2B are illustrations of front views of the apparatus for die bonding, in accordance with some other embodiments of the present disclosure.

In some embodiments as shown in FIG. 2A, the apparatus 100 includes a first bonding assembly 140a and a second bonding assembly 140b. The first bonding assembly 140a includes a first bonding head 150a and a second bonding head 150b, as well as a first bonding assembly actuator 142a for unitarily actuating the bonding heads 150ab vertically. The second bonding assembly 140b includes a third bonding head 150c and a fourth bonding head 150d, as well as a second bonding assembly actuator 142b for unitarily actuating the bonding heads 150cd vertically. Unitary actuation of the bonding heads 150 means that for each bonding assembly 140, the plurality of bonding heads 150 of the bonding assembly 140 are actuatable simultaneously in unison with each other. However, each bonding head 150a-d has its own independent bonding head actuation mechanism 154 for actuating the respective bonding tool 152 horizontally planarly for alignment of the die 102.

In some embodiments, the apparatus 100 includes a single bonding assembly 140. The bonding assembly 140 includes four bonding heads 150 and a bonding assembly actuator 142 for unitarily actuating the bonding heads 150 vertically. Thus, all the bonding heads 150 are actuatable simultaneously in unison with each other. However, each bonding head 150 has its own independent bonding head actuation mechanism 154 for actuating the respective bonding tool 152 horizontally planarly for alignment of the die 102.

In some embodiments as shown in FIG. 1A and FIG. 2A, the apparatus 100 includes a first bonding head 150a, a second bonding head 150b, a third bonding head 150c, and a fourth bonding head 150d. The apparatus 100 further includes a first camera assembly 160a, a second camera assembly 160b, a third camera assembly 160c, and a fourth camera assembly 160d. Each bonding head 150a-d is respectively paired with one camera assembly 160a-d. The camera assembly actuation mechanism 162 of the respective camera assembly 160a-d is configured for actuating the respective alignment cameras 170 to position the alignment cameras 170 below the respective bonding heads 150a-d. Additionally, the gantry assembly 110 is configured for actuating the alignment cameras 170 horizontally planarly to follow the respective bonding heads 150. In other words, the camera assembly 160a-d as the vision assembly concurrently align the dies 102 as the semiconductor devices picked by the bonding assemblies 150a-d to the substrate 122.

Figure 2B:
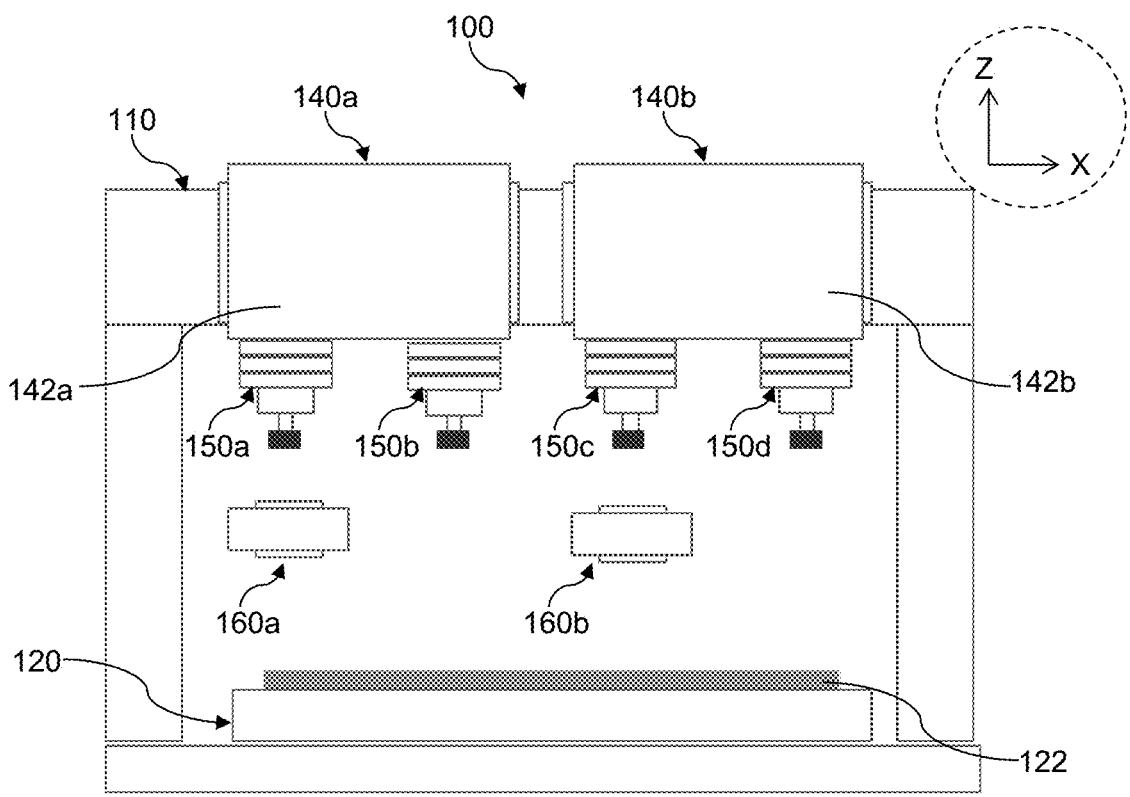

In some embodiments as shown in FIG. 2B, the apparatus 100 includes a first bonding assembly 140a and a second bonding assembly 140b. The first bonding assembly 140a includes a first bonding head 150a and a second bonding head 150b. The second bonding assembly 140b includes a third bonding head 150c and a fourth bonding head 150d. The apparatus 100 further includes a first camera assembly 160a and a second camera assembly 160b. Each bonding assembly 140ab is respectively paired with one camera assembly 160ab. The camera assembly actuation mechanism 162 of the respective camera assembly 160ab is configured for actuating the respective alignment cameras 170 to successively position the alignment cameras 170 below the respective bonding heads 150a-d of the respective bonding head assemblies 140ab. In other words, the first camera assembly 160 and the second camera assembly 160b as the vision assembly concurrently align the dies 102 as the semiconductor devices picked by the first bonding head 150a and the third bonding head 150c respectively to the substrate 122. Subsequently, the first camera assembly 160a and the second camera assembly 160b concurrently align the dies 102 picked by the second bonding head 150b and the fourth bonding head 150d respectively to the substrate 122.

Figure 3A:
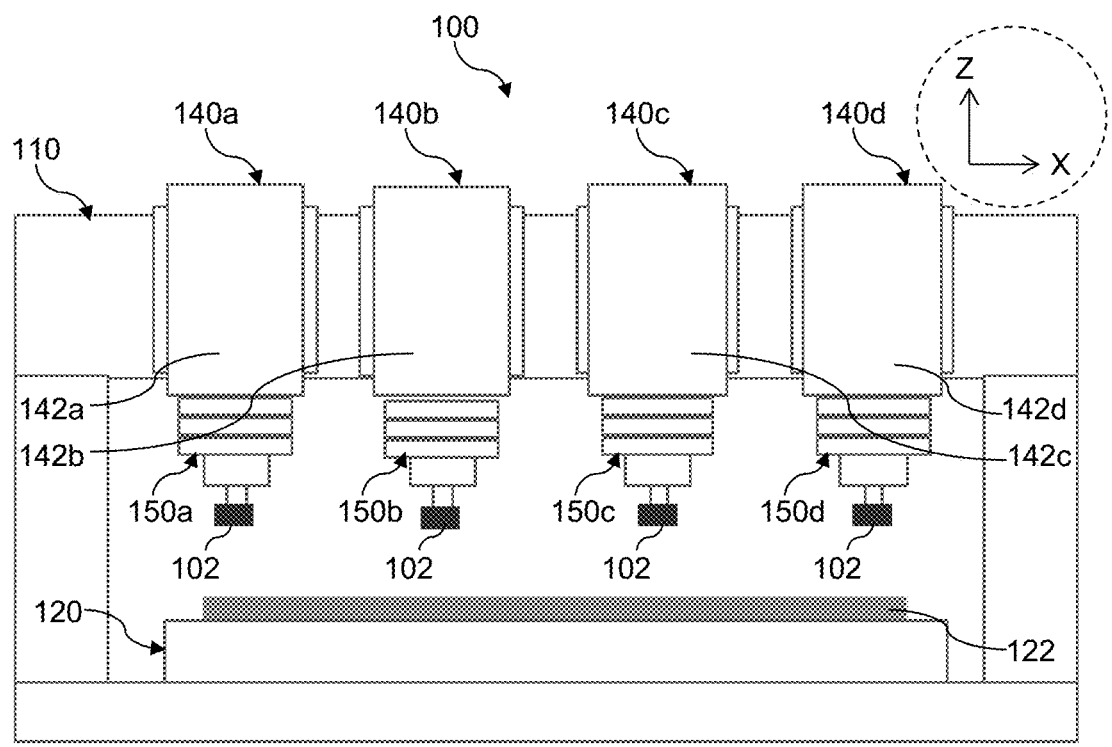
FIG. 3A and FIG. 3B are illustrations of front views of the apparatus for die bonding, in accordance with some other embodiments of the present disclosure.
Figure 3B:
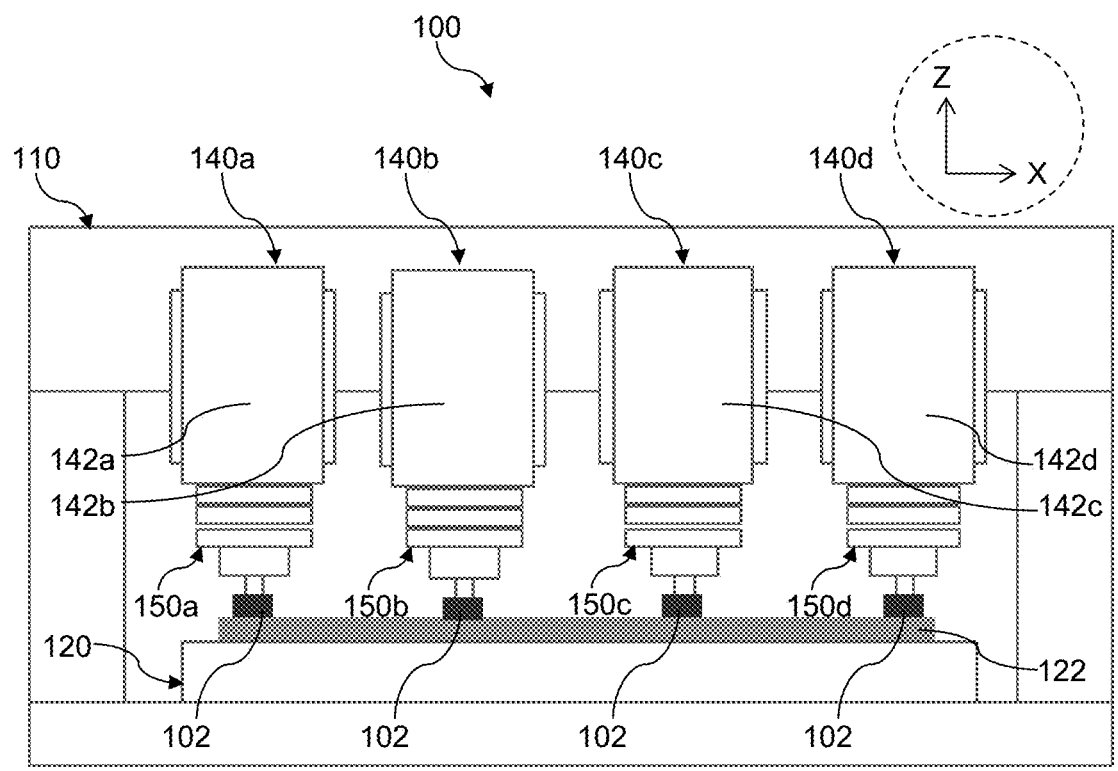

As described above, each bonding head 150 has an independent bonding head actuation mechanism 154. In some embodiments, each bonding head actuation mechanism 154 actuates the respective bonding tool 152 independently of the rest. In some other embodiments, all the bonding head actuation mechanisms 154 actuate the respective bonding tools 152 simultaneously in unison with each other. This may be referred to as collective or gang alignment of the dies 102 held by the bonding tools 152 of all the bonding heads 150. As shown in FIG. 3A and FIG. 3B, the aligning and bonding of the dies 102 occur simultaneously in unison with each other. Similarly, the picking of the dies 102 by the bonding tools 152 may also occur simultaneously in unison with each other.

The bonding tools 152 of the bonding heads 150 may include, but are not limited to, collets for picking the dies 102 by vacuum suction, gripping, or other means known to the skilled person. The bonding tools 152 may be removably attached to the bonding heads 150 so that the bonding tools 152 can be easily replaced, such as to match different dies 102 of varying sizes. The bonding head actuation mechanisms 154 may be configured for retracting the bonding tools 152 into the bonding heads 150, such as to terminate a die bonding process or operation after all the dies 102 are bonded to the substrates 122. Each bonding head 150 optionally includes a force control unit configured for controlling an impact force of placing the die 102 on the substrate 122. For example, the force control unit has a flexible or resilient element to attenuate the impact force when the die 102 bonds to the substrate 122. The force control unit may be configured to perform said retracting of the bonding tool 152.

Figure 4A:
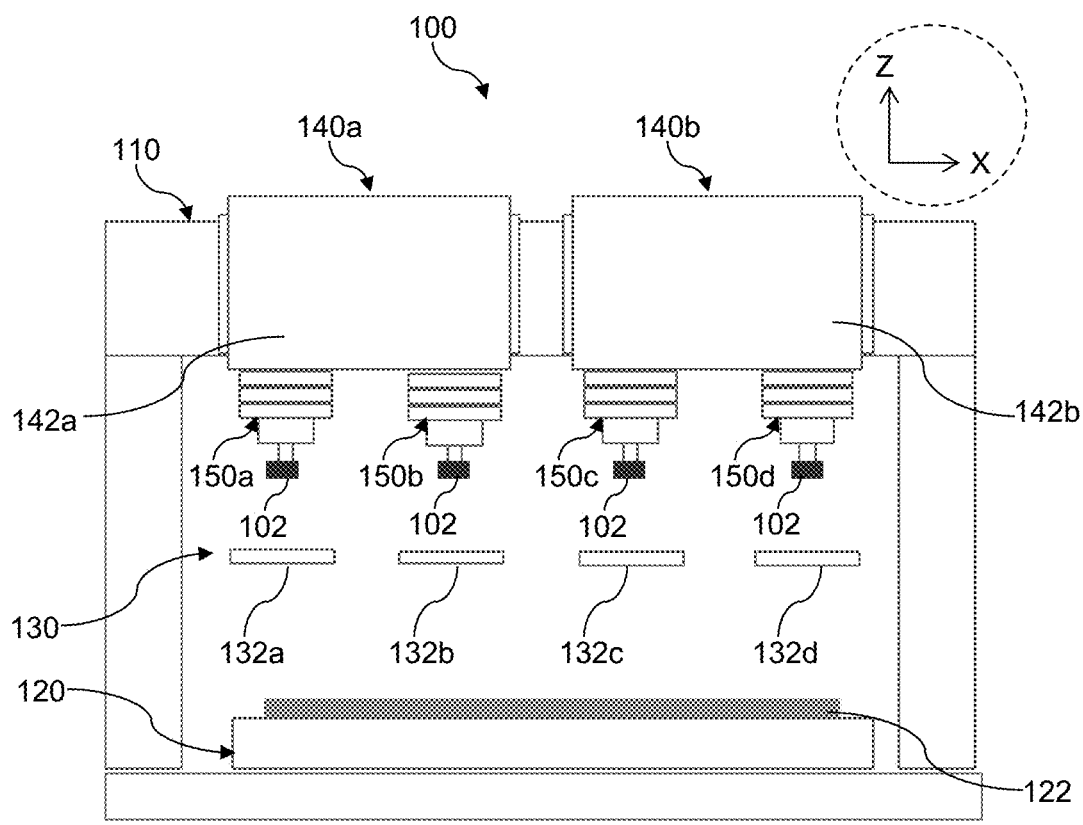
FIG. 4A to FIG. 4D are illustrations of front and side views of the apparatus including the feeder assembly, in accordance with some embodiments of the present disclosure.
Figure 4B:
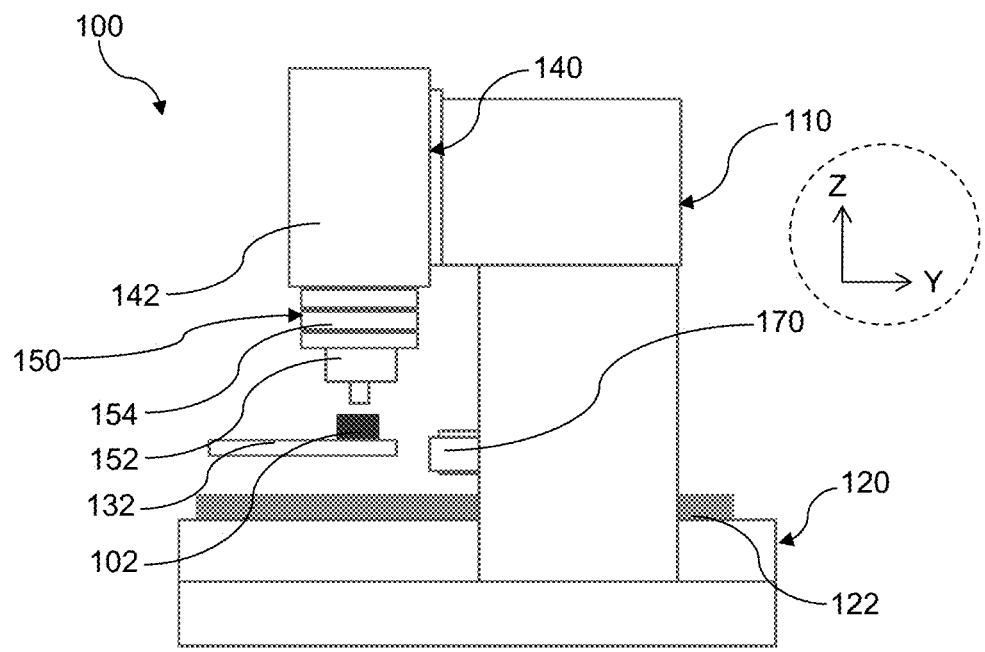

In some embodiments as shown in FIG. 4A and FIG. 4B, the feeder assembly 130 includes a set of one or more feeder units 132 actuatable or moveable between one or more die sources and the bonding heads 150. The feeder assembly 130 includes an actuation mechanism for actuating the feeder units 132. Each die source contains a set of one or more wafers wherefrom the dies 102 are picked by the feeder units 132. In one example, there is a single die source for feeding dies 102 to all the bonding heads 150. In another example, there is a first die source located on one side of the apparatus 100 and a second die source located on an opposing side of the apparatus 100. The first die source feeds dies 102 to the bonding heads 150ab, while the second die source feeds dies 102 to the bonding heads 150cd. By having more than one die source, dies 102 can be fed simultaneously to more than one bonding head 150 and more dies 102 can be more quickly bonded to the substrates 102, thereby increasing overall throughput.

In some embodiments as shown in FIG. 1F, the apparatus 100 includes a first feeder unit 132a, a second feeder unit 132b, a third feeder unit 132c, and a fourth feeder unit 132d. Each bonding head 150a-d is respectively paired with one feeder unit 132a-d. Each feeder unit 132a-d is configured for feeding the dies 102 singularly to the respective bonding head 150a-d.

Figure 4C:
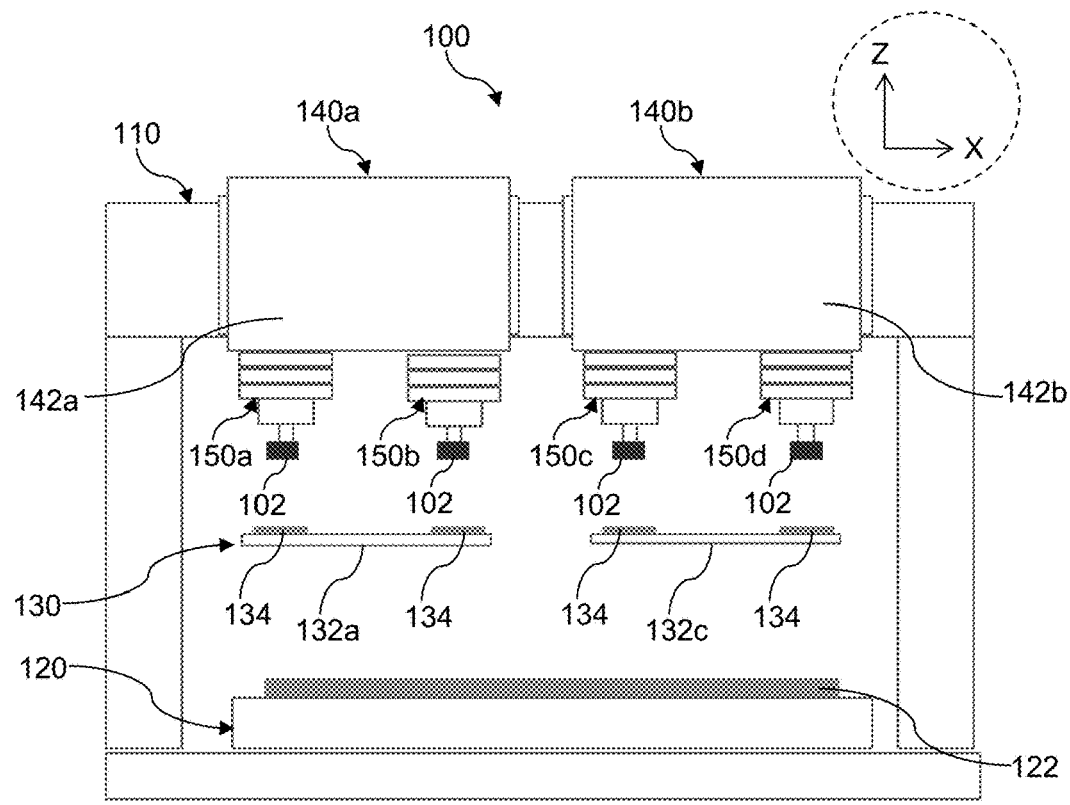

In some embodiments as shown in FIG. 4C, the apparatus 100 includes a first bonding assembly 140a, a second bonding assembly 140b, a first feeder unit 132a, and a second feeder unit 132b. Each bonding assembly 140ab is respectively paired with one feeder unit 132ab. Each feeder unit 132ab is configured for feeding the dies 102 unitarily to the respective bonding heads 150a-d of the respective bonding head assemblies 140ab. Each feeder unit 132ab includes a conversion tool 134 configured for arranging the dies 102 on the feeder unit 132ab to achieve said unitary feeding of the dies 102. Specifically, the conversion tool 134 arranges the dies 102 on the feeder unit 132ab based on a pitch of the respective bonding assembly 140ab. The pitch of the bonding assembly 140 refers to the distance between the bonding heads 150 of the bonding assembly 140. The conversion tool 134 thus spaces apart the dies 102 at the feeding unit 132 according to the distance between the respective bonding heads 150, so that the dies 102 can be fed simultaneously and accurately to the bonding heads 150.

Figure 4D:
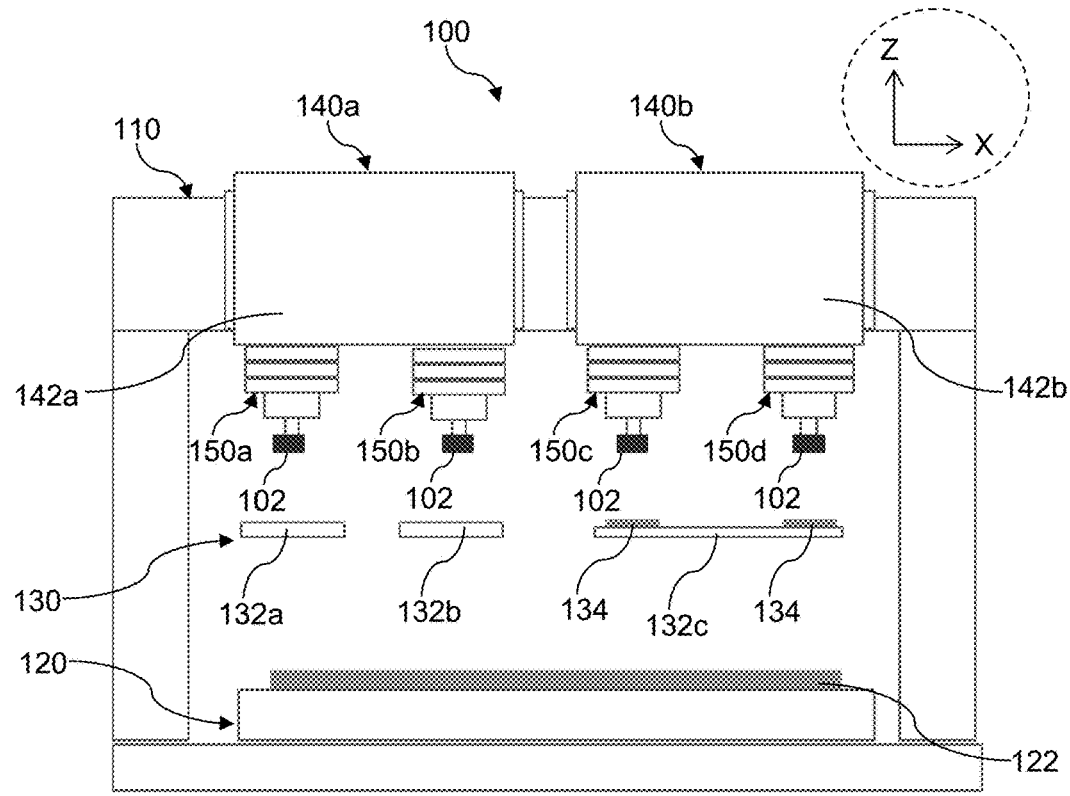

In some embodiments as shown in FIG. 4D, the apparatus 100 includes a first feeder unit 132a, a second feeder unit 132b, and a third feeder unit 132c. The first bonding head 150a is paired with the first feeder unit 132a and the second bonding head 150b is paired with the second feeder unit 132b. The first feeder unit 132a is configured for feeding the dies 102 singularly to the first bonding head 150a and the second feeder unit 132b is configured for feeding the dies 102 singularly to the second bonding head 150b. The second bonding assembly 140b with the third bonding head 150c and fourth bonding head 150d is paired with the third feeder unit 132c. The third feeder unit 132c includes the conversion tool 134 and is configured for feeding the dies 102 unitarily to the bonding heads 150cd.

Figure 5A:
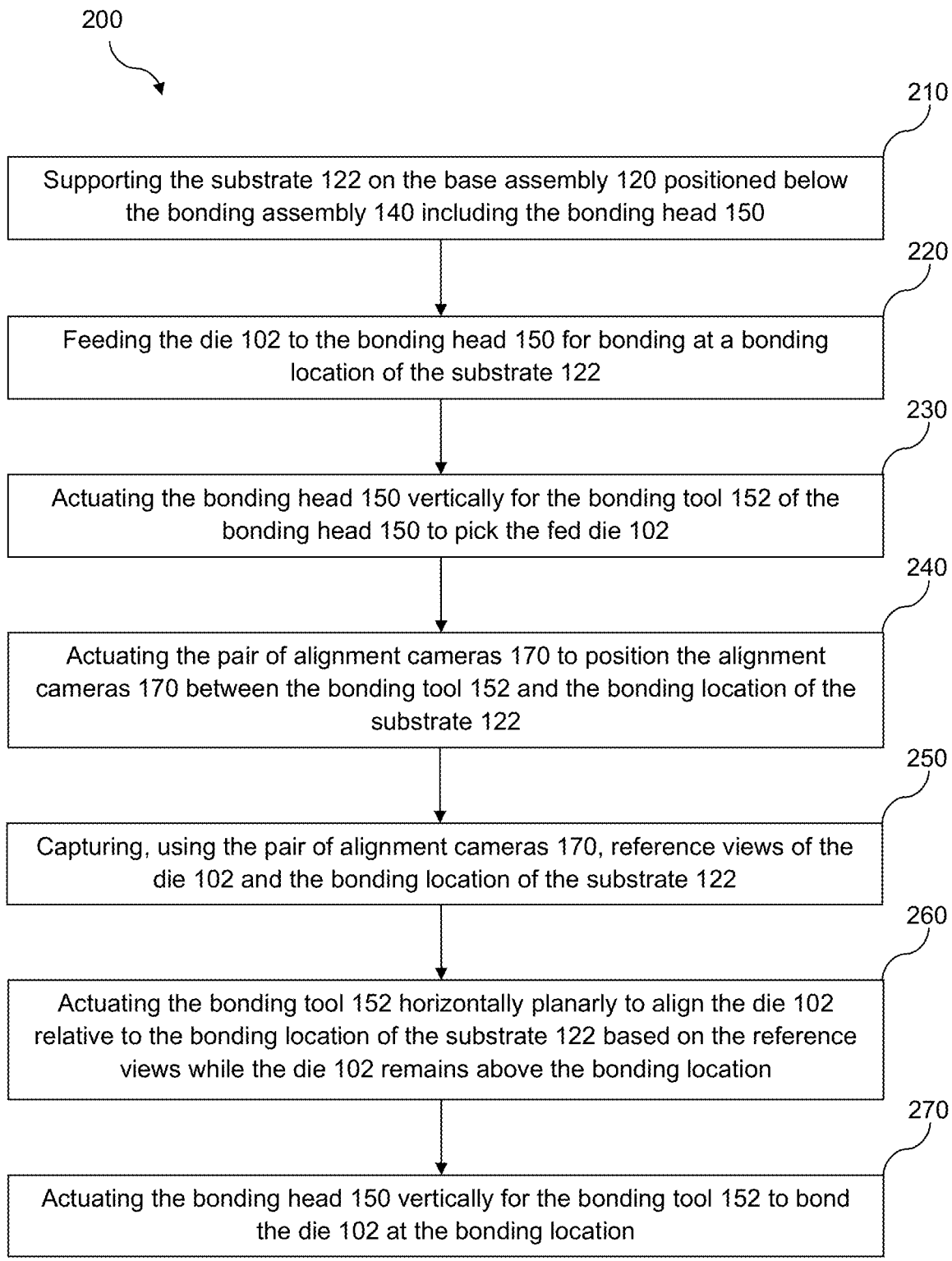
FIG. 5A is a flowchart illustration of a method for die bonding, in accordance with embodiments of the present disclosure.
Figure 5B:
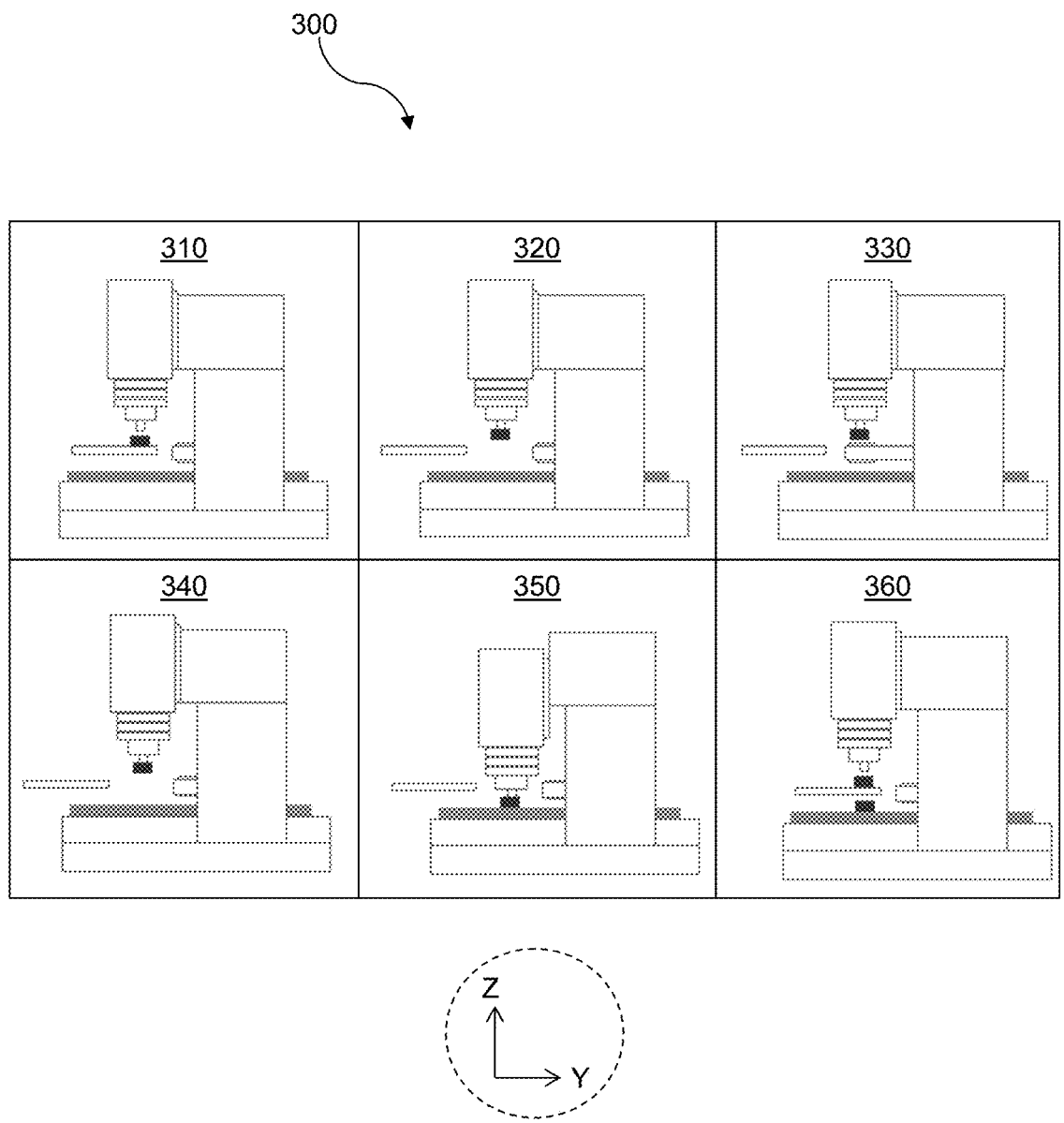
FIG. 5B are illustrations of side views of the apparatus at various steps of the method for die bonding, in accordance with embodiments of the present disclosure.

In representative or exemplary embodiments of the present disclosure, there is a method 200 for die bonding that is performed by the apparatus 100. The method 200 is described with reference to FIG. 5A in exemplary embodiments of bonding a die 102 onto a substrate 122 using various embodiments of the apparatus 100 described above. FIG. 5B illustrates various side views 300 of the apparatus 100 at various steps of the method 200.

The method 200 includes a step 210 of supporting the substrate 122 on the base assembly 120 positioned below the bonding assembly 140 including the bonding head 150. The method 200 includes a step 220 of feeding the die 102 to the bonding head 150 for bonding at a bonding location of the substrate 122. As shown in side view 310, a feeder unit 132 of the feeder assembly 130 is positioned below the bonding head 150 for feeding the die 102 to the bonding head 150.

The method 200 includes a step 230 of actuating the bonding head 150 vertically for the bonding tool 152 of the bonding head 150 to pick the fed die 102. Specifically, the bonding assembly actuator 142 moves the bonding head 150 vertically downwards to pick the die 102 from the feeder unit 132. For example, the bonding tool 152 includes a collet that uses vacuum suction to pick the die 102. As shown in side view 320, the die 102 is picked by the bonding tool 152 and the feeder unit 132 is actuated away from the bonding head 150.

The method 200 includes a step 240 of actuating the pair of alignment cameras 170 to position the alignment cameras 170 between the bonding tool 152 and the bonding location of the substrate 122. Specifically, the camera assembly actuation mechanism 162 moves the alignment cameras 170 to position the uplook camera 172 and downlook camera 174 between the bonding tool 152 and the bonding location of the substrate 122. Notably, the uplook camera 172 and downlook camera 174 are positioned such that the die 102 and bonding location are within the respective field of view. As shown in side view 330, the uplook camera 172 is positioned looking vertically upwards to target sight the die 102 held by the bonding tool 152 and the downlook camera 174 is positioned looking vertically downwards to target sight the bonding location of the substrate 122.

The method 200 includes a step 250 of capturing, using the pair of alignment cameras 170, reference views of the die 102 and the bonding location of the substrate 122. Specifically, the uplook camera 172 captures a reference view of the die 102 and the downlook camera 174 captures a reference view of the bonding location of the substrate 122. The reference views may include demarcated patterns of the die 102 and the bonding location of the substrate 122. The demarcated patterns may be in the form of fiducial marks on the die 102 and substrate 122, such as at corners of the die 102 and at corners of the bonding location of the substrate 122. The demarcated patterns or fiducial marks may also be in the form of crosshairs representing the centres of the die 102 and bonding location. These demarcated patterns allow the uplook camera 172 and downlook camera 174 to locate the centres and horizontal angular orientations of the die 102 and the bonding location of the substrate 122 relative to the optical axes of the uplook camera 172 and downlook camera 174, respectively. The demarcated patterns may be formed by a marking process such as ink marking and laser marking. An example of ink marking is pad printing which transfers an ink pattern to the die 102 and substrate 122. An example of laser marking is laser engraving or etching to physically form fiducial marks on the die 102 and substrate 122.

The method 200 includes a step 260 of actuating the bonding tool 152 horizontally planarly to align the die 102 relative to the bonding location of the substrate 122 based on the reference views while the die 102 remains above the bonding location. Said aligning includes calculating an alignment offset between the die 102 and the bonding location based on the reference views. Said aligning further includes calculating, based on the alignment offset, planar and/or angular motions of the bonding tool 152 along a horizontal plane (XY-plane). The bonding tool 152 is actuated by the bonding head actuation mechanism 154 for performing the planar and/or angular motions. The actuation of the bonding tool 152 aligns the die 102 to the bonding location of the substrate 122 by correcting misalignments along one or more of the X-axis, Y-axis, and angular ⊖. As the die 102 is already positioned and remains above the bonding location during this correction of misalignment, the actuation of the bonding tool 152 is very small and indiscernible to the naked eye, typically in the order of microns. As shown in side view 340, the alignment cameras 170 are actuated away from the bonding head 150 and the bonding tool 152 is actuated to align the die 102 relative to the bonding location of the substrate 122.

In some embodiments, the uplook camera 172 and downlook camera 174 are axially aligned to each other. Specifically, the optical axes of the uplook camera 172 and downlook camera 174 are vertical and collinear such that there is zero offset distance between the optical axes. In some other embodiments, the optical axes of the uplook camera 172 and downlook camera 174 are vertical and parallel to each other such that there is a non-zero offset distance between the optical axes. It will be appreciated that a calibration process may be performed before beginning the method 200 for die bonding. The calibration process may be performed using a transparent block such as a glass block containing reference markers for alignment of the optical axes, as will be readily understood by the skilled person.

The position (X-axis and Y-axis) and orientation (angular ⊖) of the die 102 can be calculated based on the reference view thereof relative to the optical axis of the uplook camera 172. Similarly, the position (X-axis and Y-axis) and orientation (angular ⊖) of the bonding location of the substrate 122 can be calculated based on the reference view thereof relative to the optical axis of the downlook camera 174. Since any offset distance between the optical axes is known, the alignment offset for actuating the bonding tool 152 can be calculated to correct the position of the die 102 to that of the bonding location of the substrate 122.

The method 200 includes a step 270 of actuating the bonding head 150 vertically for the bonding tool 152 to bond the die 102 at the bonding location. Specifically, the bonding assembly actuator 142 moves the bonding head 150 vertically downwards to place and bond the die 102 at the bonding location. For example, when the die 102 is placed in contact with the bonding location, collet of the bonding tool 152 releases the vacuum suction to release and bond the die 102. As shown in side view 350, the bonding head 150 is actuated vertically downwards to bond the die 102 at the bonding location of the substrate 122. Furthermore, there may be other bonding heads 150 that simultaneously bond other dies 102 to respective bonding locations of the substrate 122, thereby increasing overall throughput.

As shown in side view 360, the bonding head 150 is actuated vertically upwards after the die 102 is bonded. The feeder unit 102 takes a new die 102 from the die source and transfers the new die 102 to the bonding head 150. The gantry assembly 110 actuates the bonding assembly 140 horizontally planarly to position the bonding head 150 above the next bonding location of the substrate 122 and the new die 102 is picked by the bonding tool 152. The gantry assembly 110 actuates the alignment cameras 170 horizontally planarly to follow the bonding head 150 for alignment of the new die 102. The new die 102 is subsequently aligned and bonded at the next bonding location in a similar manner as that described in the method 200 and side views 300. It will be appreciated that the bonding assembly 140 is continually actuated to position the bonding head 150 above successive bonding locations, eventually bonding all the dies 102 at all the bonding locations of the substrate 122. The alignment cameras 170 are similarly continually actuated to follow the bonding head 150.

In many embodiments, the apparatus 100 includes four bonding heads 150—a first bonding head 150a, a second bonding head 150b, a third bonding head 150c, and a fourth bonding head 150d—for bonding dies 102 to a set of one or more substrates 122 supported on the base assembly 120. Each substrate 122 is lined with an adhesive laminate/tape to facilitate bonding of the dies 102 on the substrate 122. The adhesive laminate assists in stabilizing the aligned die 102 when it is being placed and bonded at the respective bonding location of the substrate 122, thus minimizing misalignment at the point of impact on the substrate 122 and improving positional accuracy of the bonded die 102 at the respective bonding location. The adhesive laminate includes, but is not limited to, Mylar paper or sheet. It will be appreciated that the adhesive laminate may be any type of semiconductor equipment laminate/tape known to the skilled person.

Figure 6A:
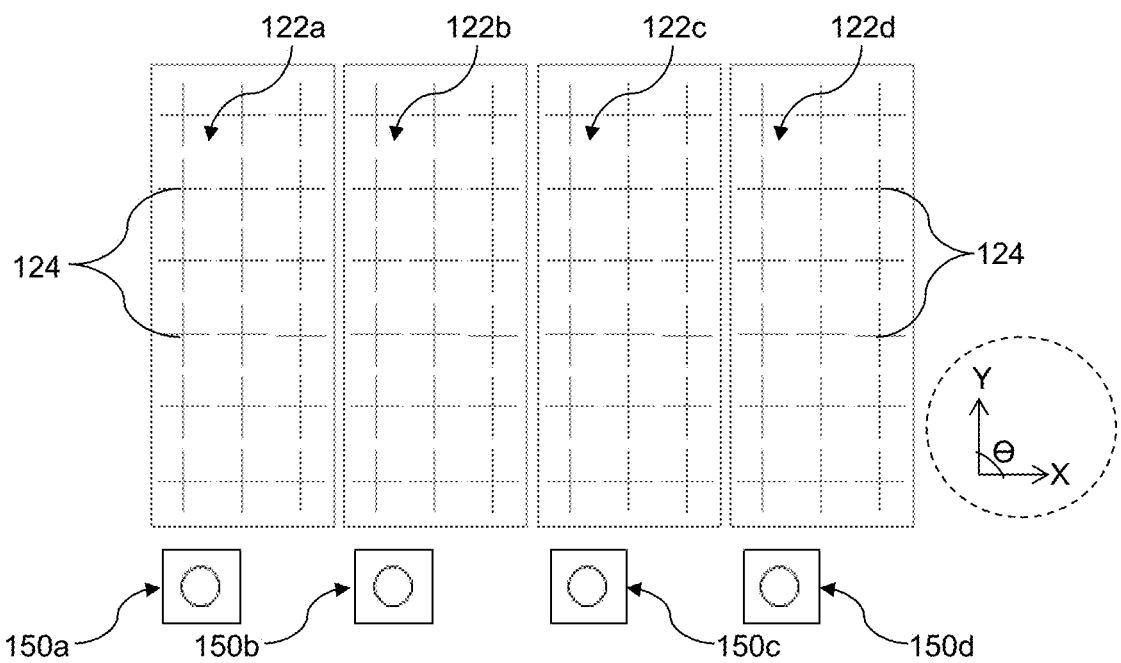
FIG. 6A and FIG. 6B are illustrations of top planar views of substrates for die bonding, in accordance with embodiments of the present disclosure.

In some embodiments as shown in FIG. 6A, four individual substrates 122a-d are supported on the base assembly 120. Each substrate 122a-d has an array of bonding locations 124 and each of the four bonding heads 150a-d is configured to target the respective substrate 122a-d. Since each bonding head 150a-d is configured for bonding dies 102 at the bonding locations 124 of one substrate 122a-d, all the dies 102 can be bonded more quickly to all the substrates 122a-d, thereby increasing overall throughput. Although FIG. 6A shows four substrates 122a-d, it will be appreciated that the base assembly 120 can support any number of substrates 122 and any number of bonding heads 150 can target any number of the substrates 122.

Figure 6B:
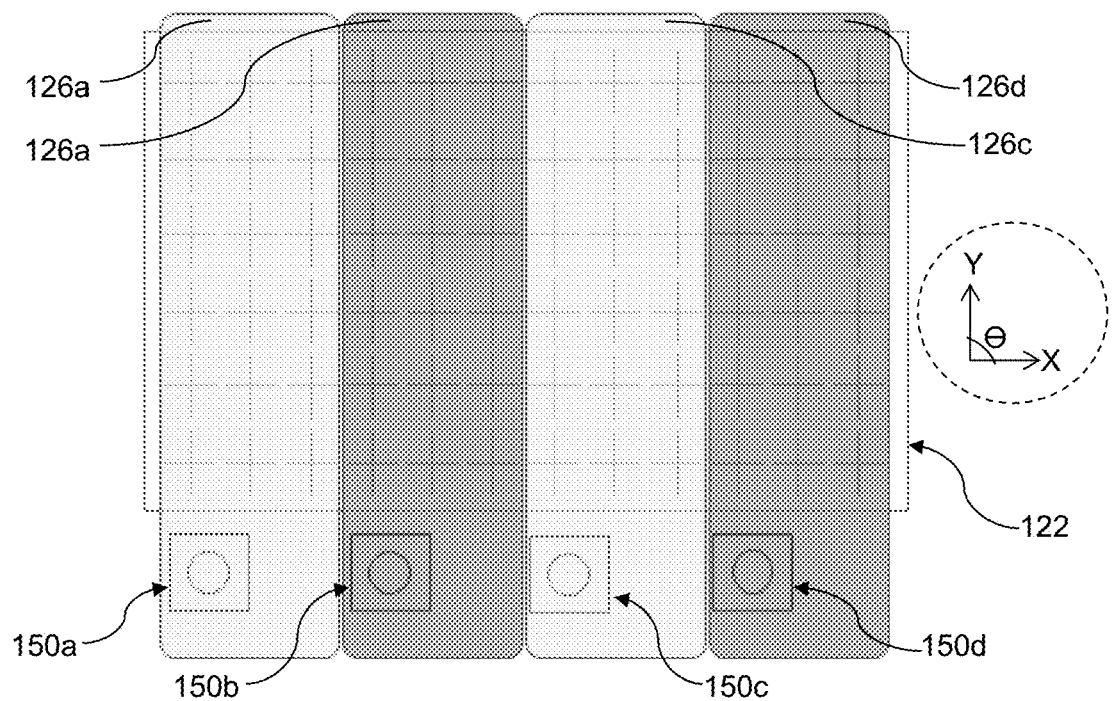

In some embodiments as shown in FIG. 6B, a single substrate 122 is supported on the base assembly 120. The substrate 122 is demarcated into four areas 126a-d and each substrate area 126a-d has an array of bonding locations 124. Each of the four bonding heads 150a-d is configured to target the respective substrate area 126a-d. The substrate 122 has the array of bonding locations 124 in 6 rows and 12 columns. The first bonding head 150a targets the first substrate area 126a (1st to 3rd columns), the second bonding head 150b targets the second substrate area 126b (4th to 6th columns), the third bonding head 150c targets the third substrate area 126c (7th to 9th columns), and the fourth bonding head 150d targets the fourth substrate area 126d (10th to 12th columns).

Before performing the method 200 for bonding dies 102 to the substrate 122, a processor of the apparatus 100 determines the pitch of the substrate 122. The pitch of the substrate 122 refers to the distance between the columns of bonding locations 124. The processor then determines the pitch of the bonding assemblies 140, specifically the distance between the bonding heads 150a-d. The pitch of the substrate 122 may be referred to as the unit pitch, while the pitch of the bonding assemblies 140 may be referred to as the runtime pitch. As an example, the unit pitch is 20 mm and the runtime pitch is thus 60 mm, since each of the bonding heads 150a-d is targeting three columns of bonding locations 124. The respective bonding head actuation mechanism 154 of the bonding heads 150a-d actuate the respective bonding heads 150a-d horizontally along the X-axis to adjust the distance between the respective bonding tools 152 according to the runtime pitch. With reference to FIG. 6B, the first bonding head 150a is positioned to the 1st column, the second bonding head 150b is positioned to the 4th column, the third bonding head 150c is positioned to the 7th column, and the fourth bonding head 150d is positioned to the 10th column.

In some embodiments, the substrate 122 has the array of bonding locations 124 in 11 columns. The first to third bonding heads 150a-c target the first to third substrate areas 126a-c (1st to 9th columns), but the fourth bonding head 150d targets the fourth substrate area 126d having two columns instead of three (10th and 11th columns). The unit pitch remains unchanged at 20 mm and the runtime pitch also remains unchanged at 60 mm. It will be appreciated that the runtime pitch may be different depending on the number of columns of bonding locations 124 on the substrate 122 and the allocation of bonding heads 150 to the columns. For example, fewer columns with the same number of bonding heads 150 may decrease the runtime pitch. Similarly, fewer number of bonding heads 150 with the same number of columns may increase the runtime pitch. The runtime pitch of the bonding assemblies 140 can be dynamically updated by the processor according to the successive substrates 122.

As described in various embodiments herein, the apparatus 100 and method 200 are able to perform die bonding at high speed with high positional accuracy compared to existing apparatuses. Similar to these existing apparatuses, reference views or images of the dies 102 and respective bonding locations of the substrate 122 are captured after the dies 102 are picked by the bonding tool 152. The feeder assembly 130 feeds the dies 102 from the die sources, e.g. wafers, to the bonding heads 150 at high speed which is necessary to increase overall throughput as the feeder units 132 need to move significant distances between the die sources and the bonding heads 150, these distances being in the order of tens of centimetres to metres. The high speed movement of the feeder units 132 sacrifices accuracy which causes misalignment between the dies 102 and the respective bonding locations when the dies 102 are picked by the bonding tools 152. This misalignment is corrected by cooperation of the alignment cameras 170, specifically the uplook cameras 172 targeting the dies 102 and the downlook cameras 174 targeting the bonding locations, and the bonding head actuation mechanisms 154.

The cameras 170 capture reference views of the dies 102 and bonding locations and calculate the misalignments or alignment offsets that need to be corrected. The alignment offsets may be along one or more of the X-axis, Y-axis, and angular $\Theta$. These alignment offsets are typically in the order of microns. As such, actuations of the bonding tools 152 by the bonding head actuation mechanisms 154 are very small and can be completed very quickly. Due to the micro movements of the bonding tools 152, there would be minimal to no residual vibrations after the corrections are completed, thus improving positional accuracy when the dies 102 are bonded to the bonding locations. Furthermore, as the mass of the bonding tools 152 is small compared to the bonding assemblies 140, finer control of actuating the bonding tools 152 and thus better positional accuracies can be achieved.

The apparatus 100 and method 200 can thus achieve much quicker and more efficient die bonding since the die misalignments can be corrected much more quickly. This increases overall throughput without compromising on positional accuracy of the bonded dies 102 on the substrates 122. The bonded substrates 122 produced by the apparatus 100 and method 200 are thus of higher quality and better reliability. To further increase overall throughput, the apparatus 100 can be configured to have more bonding assemblies 140 and/or bonding heads 150, each bonding head 150 being able to independently perform alignment of the dies 102.

In the foregoing detailed description, embodiments of the present disclosure in relation to an apparatus and a method for die bonding are described with reference to the provided figures. The description of the various embodiments herein is not intended to call out or be limited only to specific or particular representations of the present disclosure, but merely to illustrate non-limiting examples of the present disclosure. The present disclosure serves to address at least one of the mentioned problems and issues associated with the prior art. Although only some embodiments of the present disclosure are disclosed herein, it will be apparent to a person having ordinary skill in the art in view of this disclosure that a variety of changes and/or modifications can be made to the disclosed embodiments without departing from the scope of the present disclosure. Therefore, the scope of the disclosure as well as the scope of the following claims is not limited to embodiments described herein.

The invention claimed is:

1. An apparatus for semiconductor device bonding, the apparatus comprising:
   (a) a gantry assembly comprising a gantry actuation mechanism;
   (b) a base assembly for supporting at least one substrate;
   (c) at least one bonding assembly attached to the gantry assembly and positioned above the base assembly, the at least one bonding assembly comprising two or more bonding heads and a bonding assembly actuator, wherein the gantry actuation mechanism moves and positions the two or more bonding heads horizontally planarly and the bonding assembly actuator moves and positions the two or more bonding heads vertically, the two or more bonding heads configured for concurrently picking up and moving a plurality of semiconductor devices both horizontally planarly along an X-axis and a Y-axis and vertically, and concurrently bonding the plurality of semiconductor devices at respective bonding locations on the at least one substrate; and
   (d) at least one vision assembly attached to the gantry assembly and moved by the gantry actuation mechanism concurrently with the two or more bonding heads, the at least one vision assembly comprising a plurality of pairs of alignment cameras, each pair of alignment cameras comprising an uplook camera configured to look vertically upward to target sight and capture an upward reference view of a corresponding one of the plurality of semiconductor devices picked up by the corresponding one of the two or more bonding heads, and a downlook camera axially aligned to the uplook camera to look vertically downward to target sight and capture a downward reference view of a corresponding bonding location on the at least one substrate, wherein the plurality of semiconductor devices are aligned by micro movements of a portion of the two or more bonding heads relative to the respective bonding locations, based on the upward and downward reference views captured by the respective pairs of alignment cameras thereby concurrently aligning the plurality of semiconductor devices to correct for an alignment offset with the corresponding bonding locations on the at least one substrate.

2. The apparatus of claim 1, wherein
each of the two or more bonding heads comprises:
a bonding tool for holding one of the plurality of semiconductor devices; and
a bonding head actuation mechanism for moving the bonding tool horizontally planarly to align a respective semiconductor device relative to the respective bonding location of the at least one substrate while the respective semiconductor device remains above the respective bonding location.

3. The apparatus of claim 2, wherein each at least one vision assembly comprises
   (i) a vision assembly actuation mechanism for moving the alignment cameras to a position between the bonding tools and respective bonding locations,
   wherein the semiconductor devices are aligned relative to the respective bonding locations based on the respective reference views.

4. The apparatus of claim 3, wherein the bonding head actuation mechanism of each of the two or more bonding heads moves the respective bonding tool in planar and/or angular motions along a horizontal plane.

5. The apparatus of claim 3, wherein each of the two or more bonding heads is paired with one of the at least one vision assembly, the vision assembly actuation mechanism thereof configured for moving the alignment cameras to a position below the respective two or more bonding heads.

6. The apparatus of claim 3, wherein each at least one bonding assembly is paired with one vision assembly, the vision assembly actuation mechanism thereof is configured for moving the alignment cameras to a successively position below the two or more bonding heads of the bonding assembly.

7. The apparatus of claim 3, wherein the gantry assembly is configured for:
   moving the at least one bonding assembly horizontally planarly to position the two or more bonding heads above respective bonding locations on the at least one substrate; and
   moving the plurality of pairs of alignment cameras horizontally planarly to follow the respective two or more bonding heads.

8. The apparatus of claim 3, wherein the bonding tools are removably attached to the respective two or more bonding heads.

9. The apparatus according to claim 2, wherein the bonding head actuation mechanism comprises an X-axis actuator and a Y-axis actuator for respectively performing translational motions along the X-axis and the Y-axis of an XY plane horizontal to the at least one substrate, and an angular actuator for performing an angular motion.

10. A method for bonding a plurality of semiconductor devices to at least one substrate using the apparatus of claim 2, the method comprising the steps of:
   supporting the at least one substrate on the base assembly positioned below the at least one bonding assembly comprising the two or more bonding heads;
   feeding a plurality of semiconductor devices to the two or more bonding heads for concurrently bonding at the respective bonding locations on the at least one substrate;
   actuating each of the two or more bonding heads vertically for the bonding tool of the two or more bonding heads to concurrently pick the fed plurality of semiconductor devices;
   actuating the plurality of pairs of alignment cameras to position the alignment cameras between the bonding tools and the corresponding bonding locations;
   capturing, using the pairs of alignment cameras, the upward reference views of the corresponding ones of the plurality of semiconductor devices and the downward reference views of the corresponding bonding locations;
   moving the bonding tools horizontally planarly along the X-axis and the Y-axis to align the respective semiconductor devices relative to the respective bonding locations based on the upward and downward reference views while the respective semiconductor devices remain above the respective bonding locations; and
   actuating the two or more bonding heads vertically for the bonding tools to concurrently bond the plurality of semiconductor devices at the respective bonding locations.

11. The method according to claim 10, wherein the aligning comprises calculating the alignment offset between the plurality of semiconductor devices and the respective bonding locations based on the upward and downward reference views.

12. The method according to claim 10, wherein the upward and downward reference views comprise demarcated patterns of the plurality of semiconductor devices and the respective bonding locations.

* * * * *